US010570502B2

(12) United States Patent
Soules et al.

(10) Patent No.: US 10,570,502 B2
(45) Date of Patent: Feb. 25, 2020

(54) ALKALI RESISTANT OPTICAL COATINGS FOR ALKALI LASERS AND METHODS OF PRODUCTION THEREOF

(71) Applicant: Lawrence Livermore National Security, LLC, Livermore, CA (US)

(72) Inventors: Thomas F. Soules, Livermore, CA (US); Raymond J. Beach, Livermore, CA (US); Scott C. Mitchell, Tracy, CA (US); Gary DeBell, Los Altos, CA (US)

(73) Assignee: Lawrence Livermore National Security, Livermore, CA (US)

( * ) Notice: Subject to any disclaimer, the term of this patent is extended or adjusted under 35 U.S.C. 154(b) by 870 days.

(21) Appl. No.: 14/531,875

(22) Filed: Nov. 3, 2014

(65) Prior Publication Data

US 2015/0047970 A1 Feb. 19, 2015

Related U.S. Application Data

(62) Division of application No. 13/023,841, filed on Feb. 9, 2011, now Pat. No. 8,889,251.

(51) Int. Cl.
*C23C 14/08* (2006.01)
*B32B 7/02* (2019.01)
(Continued)

(52) U.S. Cl.
CPC ................ *C23C 14/08* (2013.01); *B32B 7/02* (2013.01); *C23C 14/081* (2013.01); (Continued)

(58) Field of Classification Search
CPC ...................................................... C23C 14/08
See application file for complete search history.

(56) References Cited

U.S. PATENT DOCUMENTS 4,182,972 A * 1/1980 Kaneno ................. C04B 35/115 313/636
5,472,795 A * 12/1995 Atita ....................... B32B 18/00 428/610

(Continued)

OTHER PUBLICATIONS

Dobrowolski, J.A. (eds. Bass et al.). "Optical Properties of Films and Coatings". Handbook of Optics: vol. I, Fundamentals, Techniques, and Design, (1995); pp. 42.3-42.130.*

(Continued)

*Primary Examiner* — Alex A Rolland
(74) *Attorney, Agent, or Firm* — Zilka-Kotab

(57) ABSTRACT

In one embodiment, a method for forming an alkali resistant coating includes forming a first oxide material above a substrate and forming a second oxide material above the first oxide material to form a multilayer dielectric coating, wherein the second oxide material is on a side of the multilayer dielectric coating for contacting an alkali. In another embodiment, a method for forming an alkali resistant coating includes forming two or more alternating layers of high and low refractive index oxide materials above a substrate, wherein an innermost layer of the two or more alternating layers is on an alkali-contacting side of the alkali resistant coating, and wherein the innermost layer of the two or more alternating layers comprises at least one of: alumina, zirconia, and hafnia.

17 Claims, 7 Drawing Sheets

(51) Int. Cl.

| | |
|---|---|
| ***H01S 3/034*** | (2006.01) |
| ***C23C 14/10*** | (2006.01) |
| ***C23C 14/46*** | (2006.01) |
| ***C23C 16/40*** | (2006.01) |
| ***C23C 16/455*** | (2006.01) |
| ***C23C 28/04*** | (2006.01) |
| ***C23C 28/00*** | (2006.01) |
| ***C23C 14/34*** | (2006.01) |

(52) U.S. Cl.

CPC .......... *C23C 14/082* (2013.01); *C23C 14/083* (2013.01); *C23C 14/10* (2013.01); *C23C 14/3442* (2013.01); *C23C 14/46* (2013.01); *C23C 16/401* (2013.01); *C23C 16/403* (2013.01); *C23C 16/405* (2013.01); *C23C 16/45555* (2013.01); *C23C 28/04* (2013.01); *C23C 28/042* (2013.01); *C23C 28/42* (2013.01); *C23C 28/44* (2013.01); *H01S 3/0346* (2013.01); *Y10T 428/24942* (2015.01); *Y10T 428/24975* (2015.01)

(56) References Cited

U.S. PATENT DOCUMENTS 5,935,723 A * 8/1999 Borden .................. G02B 1/115
257/E31.117
2003/0092233 A1* 5/2003 Furukawa ......... H01L 21/28194
438/200

OTHER PUBLICATIONS

Roland A. Fischer, Precursor Chemistry of Advanced Materials: CVD, ALD and Nanoparticles, Springer Science & Business Media, Sep 29, 2005.*

* cited by examiner

Cs+ + e− ⇌ Cs(s) -3.026 −3.026 [4]
Rb+ + e− ⇌ Rb(s) -2.98 −2.98 [4]
K+ + e− ⇌ K(s) -2.931 −2.931 [4]
Ba2+ + 2□e− ⇌ Ba(s) -2.912 −2.912 [4]
La(OH)3(s) + 3□e− ⇌ La(s) + 3OH− -2.90 −2.90 [4]
Sr2+ + 2□e− ⇌ Sr(s) -2.899 −2.899 [4]
Ca2+ + 2□e− ⇌ Ca(s) -2.868 −2.868 [4]
Eu2+ + 2□e− ⇌ Eu(s) -2.812 −2.812 [4]
Ra2+ + 2□e− ⇌ Ra(s) -2.8 −2.8 [4]
Na+ + e− ⇌ Na(s) -2.71 −2.71 [4][8]
La3+ + 3□e− ⇌ La(s) -2.379 −2.379 [4]
Y3+ + 3□e− ⇌ Y(s) -2.372 −2.372 [4]
Mg2+ + 2□e− ⇌ Mg(s) -2.372 −2.372 [4]
ZrO(OH)2(s) + H2O + 4□e− ⇌ Zr(s) + 4OH− -2.36 −2.36 [4]
Al(OH)4− + 3□e− ⇌ Al(s) + 4□OH− -2.33 −2.33
Al(OH)3(s) + 3□e− ⇌ Al(s) + 3OH− -2.31 −2.31
H2(g) + 2□e− ⇌ 2□H− -2.25 −2.25
Ac3+ + 3□e− ⇌ Ac(s) -2.20 −2.20
Be2+ + 2□e− ⇌ Be(s) -1.85 −1.85
U3+ + 3□e− ⇌ U(s) -1.66 −1.66 [6]
Al3+ + 3□e− ⇌ Al(s) -1.66 −1.66 [8]
Ti2+ + 2□e− ⇌ Ti(s) -1.63 −1.63 [8]
ZrO2(s) + 4□H+ + 4□e− ⇌ Zr(s) + 2□H2O -1.553 −1.553 [4]
Zr4+ + 4□e− ⇌ Zr(s) -1.45 −1.45 [4]
TiO(s) + 2□H+ + 2□e− ⇌ Ti(s) + H2O -1.31 −1.31
Ti2O3(s) + 2□H+ + 2□e− ⇌ 2□TiO(s) + H2O -1.23 −1.23
Ti3+ + 3□e− ⇌ Ti(s) -1.21 −1.21
Mn2+ + 2□e− ⇌ Mn(s) -1.185 −1.185 [4]
Te(s) + 2□e− ⇌ Te2− -1.143 −1.143 [2]
V2+ + 2□e− ⇌ V(s) -1.13 −1.13 [2]
Nb3+ + 3□e− ⇌ Nb(s) -1.099 −1.099
Sn(s) + 4□H+ + 4□e− ⇌ SnH4(g) -1.07 −1.07
SiO2(s) + 4□H+ + 4□e− ⇌ Si(s) + 2□H2O -0.91 −0.91
B(OH)3(aq) + 3□H+ + 3□e− ⇌ B(s) + 3□H2O -0.89 −0.89
TiO2+ + 2□H+ + 4□e− ⇌ Ti(s) + H2O -0.86 −0.86
Bi(s) + 3□H+ + 3□e− ⇌ BiH3 -0.8 −0.8
H2□H2O + 2□e− ⇌ H2(g) + 2□OH− -0.8277 −0.8277 [4]
Zn2+ + 2□e− ⇌ Zn(Hg) -0.7628 −0.7628 [4]
Zn2+ + 2□e− ⇌ Zn(s) -0.7618 −0.7618 [4]
Ta2O5(s) + 10□H+ + 10□e− ⇌ 2□Ta(s) + 5□H2O -0.75 −0.75
Cr3+ + 3□e− ⇌ Cr(s) -0.74 −0.74
Au[Au(CN)2]− + e− ⇌ Au(s) + 2□CN− -0.60 −0.60
Ta3+ + 3□e− ⇌ Ta(s) -0.6 −0.6

FIG. 3

ALKALI RESISTANT OPTICAL COATINGS FOR ALKALI LASERS AND METHODS OF PRODUCTION THEREOF

RELATED APPLICATIONS

This application is a divisional of U.S. application Ser. No. 13/023,841 filed on Feb. 9, 2011, which is herein incorporated by reference.

The United States Government has rights in this invention pursuant to Contract No. DE-AC52-07NA27344 between the United States Department of Energy and Lawrence Livermore National Security, LLC for the operation of Lawrence Livermore National Laboratory.

FIELD OF THE INVENTION

The present invention relates to alkali vapor resistant coatings, and more particularly, to alkali vapor resistant optical coatings for alkali lasers.

BACKGROUND

Lasers utilizing an alkali vapor are relatively new. In these lasers, the alkali atoms are excited from the ground $^2S_{1/2}$ state to the excited $^2P_{3/2}$ state by absorption of laser diode pump light and lased from the $^2P_{1/2}$ state that lies just below the pumped level. Non-radiative interstate relaxation between the $^2P_{3/2}$ and the $^2P_{1/2}$ state may be achieved through collisional deexcitation or energy transfer to a molecule, for example ethane. Because the lasing energy photon is just slightly less than the exciting photon, these lasers may be very efficient. Also, the fact that these lasers use a low density vapor means that there may be little wave front distortion.

Alkali lasers have been made using potassium, rubidium, and cesium vapors. As shown in FIG. 1, which shows the energy levels involved in lasing a rubidium line in an alkali laser, the pump photon energy (780 nm) is just slightly higher than the lasing photon energy (795 nm). The use of a vapor requires either that the vapor be of a fairly high concentration or that a reasonably long path length be provided to absorb all of the pump radiation. However, because these alkalis are very reactive materials which are commonly used for reflective and antireflective surfaces within lasers are susceptible to alkali attack, and therefore are generally poor choices for use in alkali lasers and other devices which use alkali gas.

Therefore, it would be very beneficial to have an alkali resistant material and/or coating capable of being used in alkali lasers and other devices which use alkali gas that will not be chemically attacked or allow the alkali to diffuse, but also is highly reflective or lowly reflective.

SUMMARY

In one embodiment, a method for forming an alkali resistant coating includes forming a first oxide material above a substrate and forming a second oxide material above the first oxide material to form a multilayer dielectric coating, wherein the second oxide material is on a side of the multilayer dielectric coating for contacting an alkali.

In another embodiment, a method for forming an alkali resistant coating includes forming two or more alternating layers of high and low refractive index oxide materials above a substrate, wherein an innermost layer of the two or more alternating layers is on an alkali-contacting side of the alkali resistant coating, and wherein the innermost layer of the two or more alternating layers comprises at least one of: alumina, zirconia, and hafnia.

Other aspects and embodiments of the present invention will become apparent from the following detailed description, which, when taken in conjunction with the drawings, illustrate by way of example the principles of the invention.

BRIEF DESCRIPTION OF THE DRAWINGS

FIG. 3 shows an electrochemical series.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

In one general embodiment, a multilayer dielectric coating for use in a window of an alkali laser includes two or more alternating layers of high and low index dielectric materials, wherein an innermost layer of the two or more alternating layers of high and low index dielectric materials includes at least one of: alumina, zirconia, and hafnia for protecting subsequent layers of the two or more alternating layers of high and low index dielectric materials from alkali attack.

In another general embodiment, a method for forming an alkali resistant coating includes forming a first oxide material above a substrate and forming a second oxide material above the first oxide material to form a multilayer dielectric coating, wherein the second oxide material is on a side of the multilayer dielectric coating for contacting an alkali.

Figure 1:
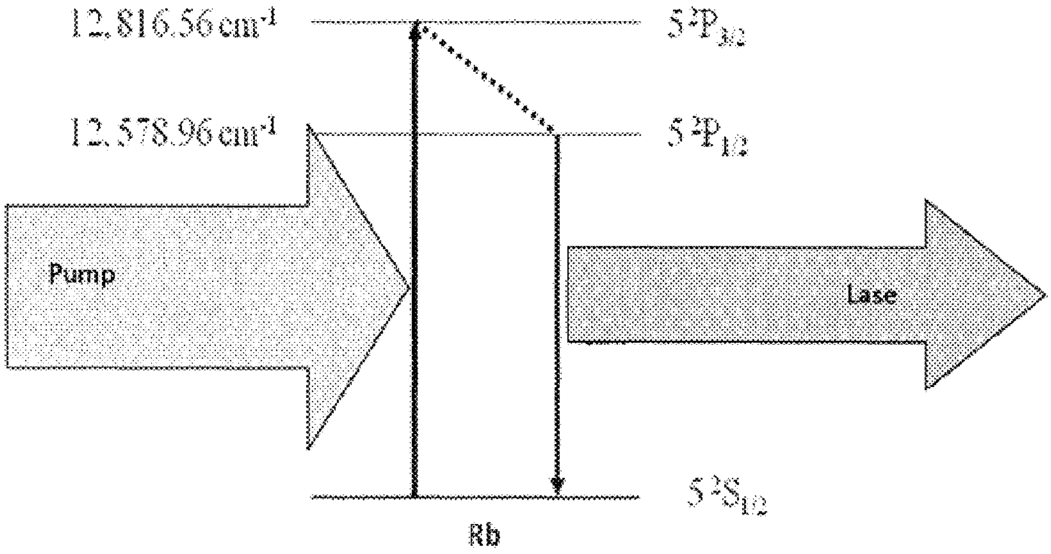
FIG. 1 shows a diagram of energy levels involved in lasing a rubidium line in an alkali laser, according to the prior art.
Figure 2:
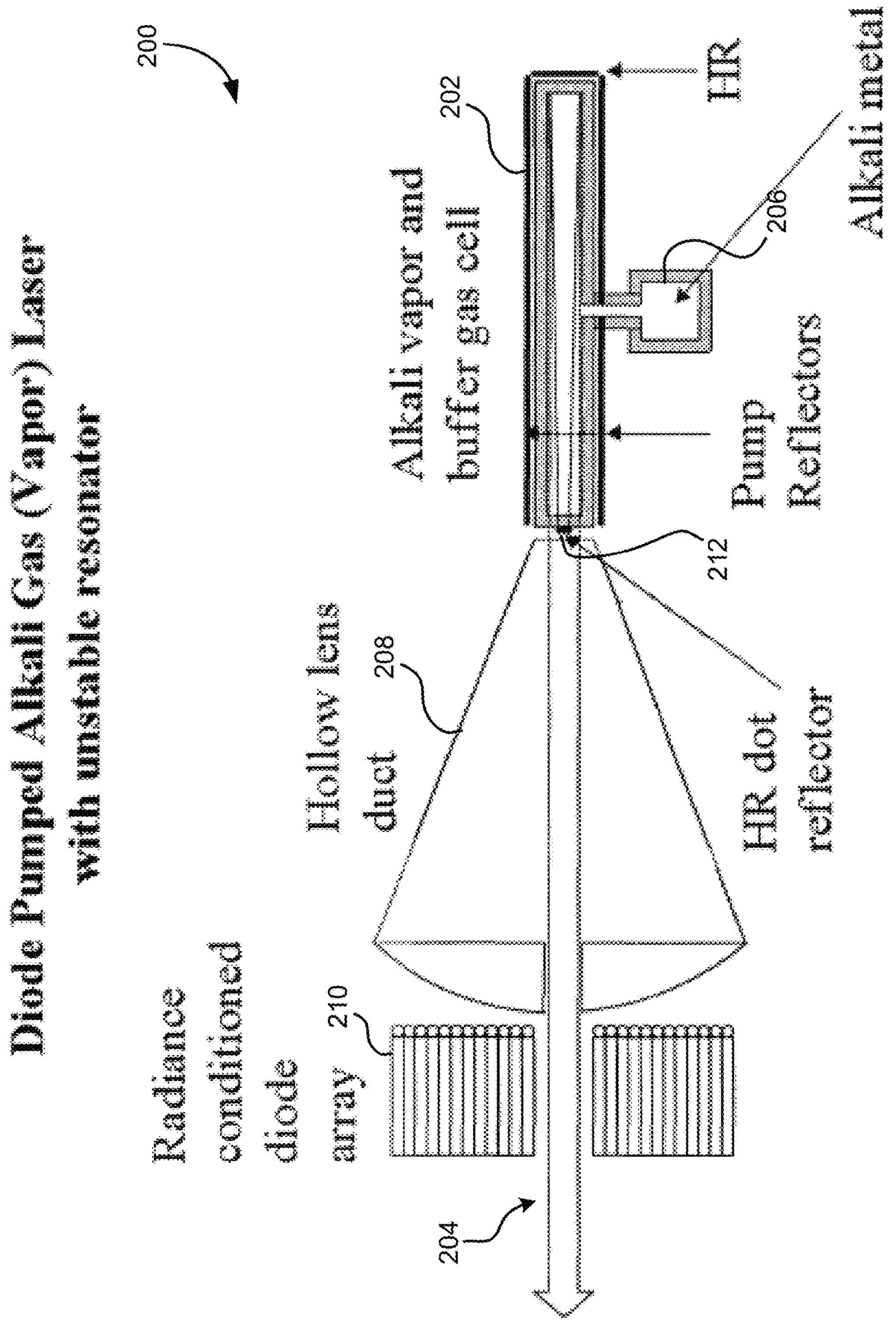
FIG. 2 shows a schematic diagram of a diode pumped alkali gas laser, according to one embodiment.

As shown in FIG. 2, which shows a schematic diagram of an alkali laser 200, the laser 200 may be end pumped, but this requires guiding the pump light down a suitable tube 202 with a highly reflective coating that serves as a light guide. This gas cell 202 will contain the alkali gas, which may attack the walls of the gas cell 202.

The high reactivity and the very electropositive nature of the alkali atoms require that special attention be paid to all the materials that are in contact with the vapor. For example, metals that otherwise might serve as reflective walls or wall coatings for the laser light guide may not be used. Gold and silver will readily form an amalgam with the alkali metal and lose their high reflectivity. Other metals that might be compatible with alkalis, such as niobium, tungsten, or other esoteric metals do not have nearly high enough reflectivity to serve as light guides. Also, commonly used dielectric stack materials, such as tantala ($Ta_2O_5$) and niobia ($Nb_2O_5$), both which have a high index of refraction, may not be used as they will be readily reduced by the alkali vapor. Silica, which has a low index of refraction, is also problematic since alkalis are known to diffuse through thin silica coatings into the open network structure of vitreous silica, rendering them unusable.

In addition, rubidium in the alkali laser is highly corrosive and reduces many materials. Polycrystalline alumina ($Al_2O_3$) (PCA) is not reduced by alkalis and is used to contain alkalis, such as in high pressure sodium lamps. Zirconia ($ZrO_2$) is close to alumina in the electrochemical series shown in FIG. 3, and is also not easily reduced. The electrochemical series in FIG. 3 indicates the relative ease with which elements and compounds may be reduced, with entries near the top of the series being more difficult to reduce than entries near the bottom. Tantala and niobia, for example, two high index materials, are much more easily reduced than is zirconia. Alumina and zirconia are near the top of the series shown in FIG. 3 which indicates that while they can be reduced by the more reactive alkalis free energy driving force, this reaction is less likely than for other potential oxide couples that are commonly used for dielectric optical coatings.

Since the possibility of an alkali laser was proposed (see Beach et al. "End-pumped continuous-wave alkali vapor lasers: experiment, model, and power scaling," *J. Opt. Soc. Am. B*., Vol. 21, No. 12, December 2004), there has been considerable interest in this new class of high power lasers. These lasers have many benefits, such as being able to be pumped by commercial laser diode bars, increased efficiency because they use a small amount of alkali vapor in an inert buffer gas (such as helium), and the ability to produce beams with little wave front distortion. However, producing a coating which may be used with these lasers has been problematic, as discussed previously.

A coating may be made highly transmissive for end windows and/or highly reflective for pump light guides, and the design of these multilayer coating stack structures is known in the state of the art. However, because of the highly reactive alkali vapors used as the lasing medium, the optical coatings must be made of materials that will not be chemically or physically attacked by the vapor. This is difficult. Metals commonly used for light guides, such as gold and silver, quickly amalgamate with the alkali and their reflectivity is rapidly degraded. Similarly, many dielectric coating materials will be quickly reduced by the highly electropositive alkali.

According to one embodiment, alumina, which is compatible with alkalis, may be used as the innermost layer in a dielectric stack coating for an alkali laser. The term innermost is hereinafter used to refer to the layer furthest from the substrate and in direct contact with the alkali containing vapor. Hence, the innermost alumina layer is exposed to the alkali vapor, and is capable of protecting any subsequent (outer) layers as long as the alumina layer has a sufficient thickness and density. Alumina is resistant to alkali vapors as evidenced by its use, for example, in high pressure sodium street lamps that contain sodium vapor at high temperatures hermetically sealed inside translucent alumina arc tubes. According to various embodiments, these optical coatings may be designed using multilayer interference films of alumina and zirconia, preferably with alumina as the innermost coating.

In addition, in further embodiments, methods for producing these coatings are presented. Commonly used vapor deposition techniques do not produce sufficiently dense films and often absorb water. Two techniques: atomic layer deposition (ALD) and ion beam sputtering (IBS) can produce the alkali resistant coatings, according to several embodiments. ALD is commonly used to produce alumina coatings to protect solar panels from moisture. It has been found that an ALD alumina coating of sufficient thickness (see embodiments below) will also protect against alkali attack. While IBS is conventionally used for many applications, it is not known to use this method of deposition to produce films that are impermeable to alkali vapors and do not take up water, which would immediately react with the alkali vapor and defeat the coatings.

Accordingly, in one embodiment, a coating includes alumina and/or zirconia in a suitable dielectric stack multilayer for a highly transmissive and highly reflective coating. Additionally, a method for producing the coating is presented in another embodiment, which includes ALD and/or IBS. The resultant coatings are found to produce robust coatings for alkali lasers.

Figure 4A:
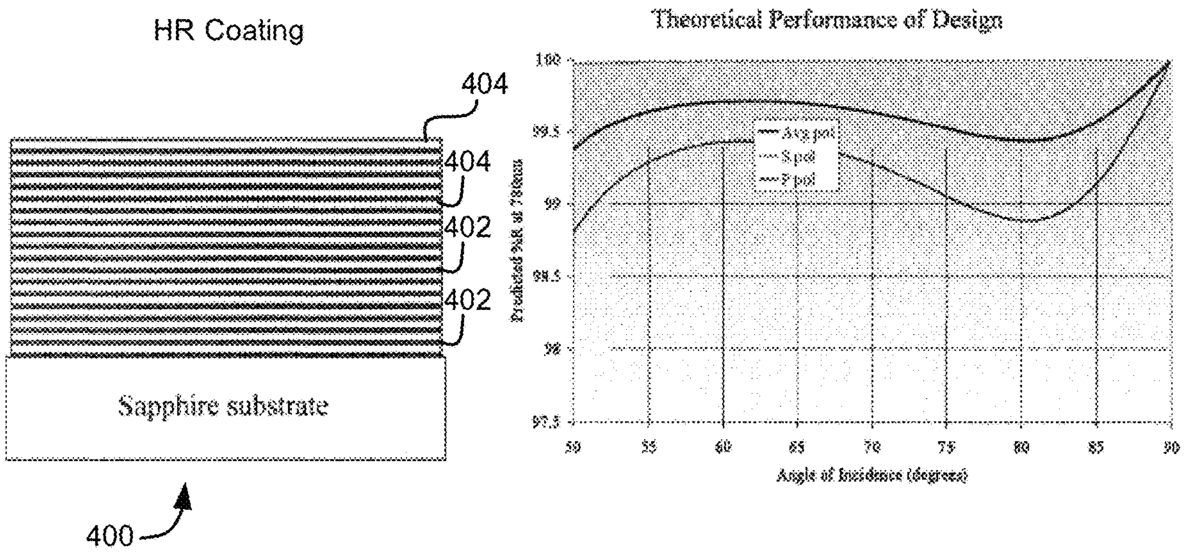
FIGS. 4A-4B show coatings that are resistant to alkali attack with corresponding plots of reflectivity (% R), according to several embodiments.
Figure 4B:
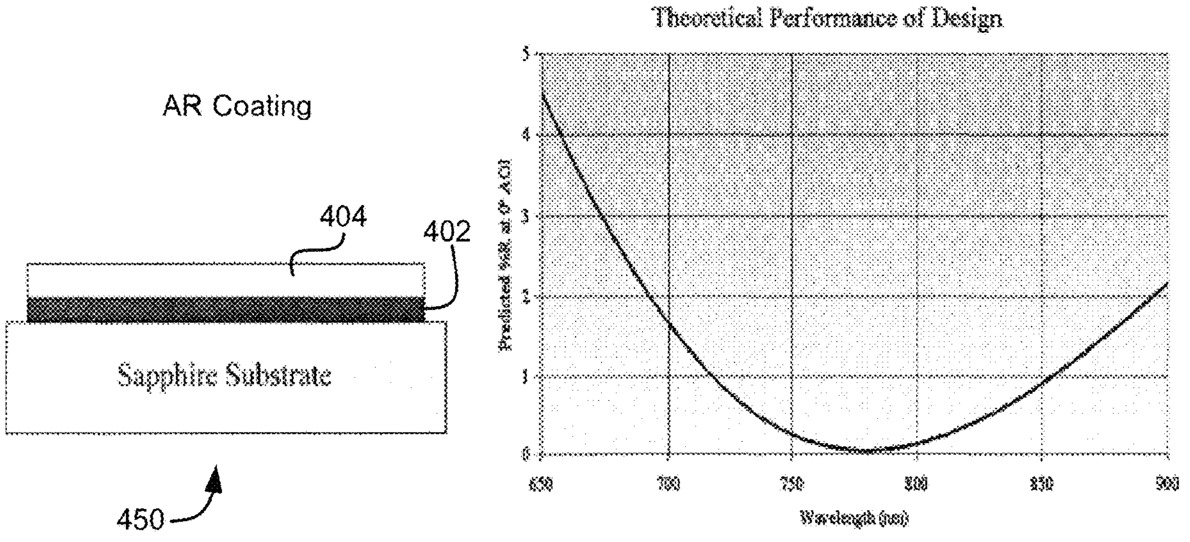

Now referring to FIGS. 4A-4B, coatings that are resistant to attack by alkali vapor, such as in an alkali vapor laser, are shown, along with corresponding plots of reflectivity (% R). In FIG. 4A, the coating design 400 may be used as a high transmission optical window (AR coating) on the end of the laser, and for high reflectivity coatings (HR coatings) along the sides of the pump light guide.

In FIG. 4B, an antireflection coating (AR) 450 is shown that may be used to reduce reflection of laser light. Referring again to FIGS. 4A-4B, the antireflection coatings (AR) 450 and/or highly reflective coatings (HR) 400 may be produced using alumina ($Al_2O_5$, $AlO_x$), zirconia ($ZrO_2$), tantala ($Ta_2O_5$, $TaO_x$), hafnia ($HfO_2$), silica ($SiO_2$), niobia ($NbO_x$), magnesium oxide ($MgO_x$), beryllium oxide (BeO), etc., according to various embodiments. The 402 layers preferably comprise zirconia, and the 404 layers preferably comprise alumina. Alumina may preferably be used as the innermost layer so that it is in contact with the alkali vapor, while the composition of the subsequent layers may be determined based on desired properties of the coating. The sketches and the graphs of reflectance next to the layer schematics are for illustrative purposes only, and not meant to be limiting in any way. The number of layers, thicknesses of layers, and/or performance characteristics may depend on the characteristics and properties of the stack.

In one embodiment, the number of layers and materials of construction may be determined using an optimization computer code as would be apparent to one of skill in the art upon reading the present descriptions. Design parameters may also depend on the specifications for laser operation. Any AR and HR optical designs employing any of these materials (zirconia, alumina, tantala, hafnia, silica, niobia, magnesium oxide, beryllium oxide, etc.) may be produced that are robust to alkali vapor environments. In addition, materials other than those listed above may be used, in various amounts and positions in the stacks, as would be understood by one of skill in the art upon reading the present descriptions as long as the innermost layer is alkali resistant and impenetrable to the alkali vapors.

In addition to having a robust coating design, the method of depositing the coatings should provide a very dense coating, one that is not porous and does not absorb water. It is important, in one embodiment, that the alumina and zirconia layers be deposited using atomic layer deposition (ALD) or ion beam sputtering (IBS) of oxide targets or some other coating technique capable of producing very dense coatings, as would be known in the art. ALD and IBS are known to produce coatings that are impervious and actually protect any substrate or subsequent layers below. Chemical vapor deposition (CVD) does not produce as dense a coating as IBS, but may still be used in some instances.

According to some embodiments, a dielectric multilayer coating comprises a high index oxide material and a low index oxide material that is resistant to reduction or any other chemical attack by an alkali, such as one chosen from a group consisting of: sodium, potassium, rubidium, and cesium, among others. In some embodiments, this dielectric multilayer coating may comprise two or more layers of alternating high and low index materials designed to produce either very low reflectance (AR coating) or very high reflectance (HR coating). The specific coating design, that is, a thicknesses of each layer, may be arrived at using standard optical coating design algorithms.

Figure 5:
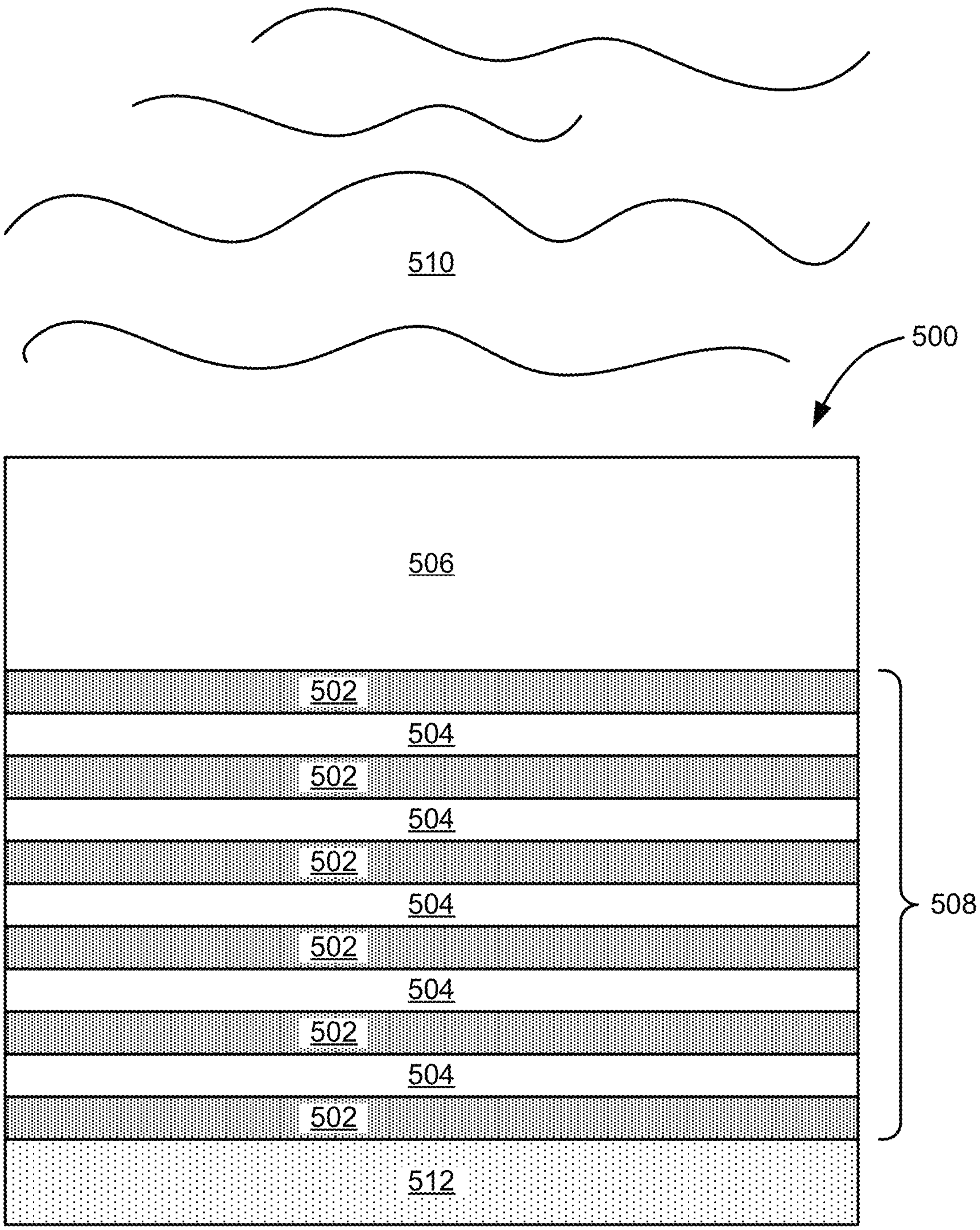
FIG. 5 shows a schematic diagram of a multilayer dielectric coating, according to one embodiment.

Now referring to FIG. 5, according to one embodiment, a multilayer dielectric coating 500 for use in alkali vapor atmospheres 510 includes two or more alternating layers of a higher index oxide material 502 and a lower index oxide material 504. The alternating layers may be formed above a substrate 512, in some approaches.

In one approach, the multilayer dielectric coating 500 may produce reflectance of less than about 5% at an angle of incidence of about 0° for a wavelength of light of between about 650 nm and about 900 nm, e.g., the coating is an AR coating. In an alternate approach, the multilayer dielectric coating 500 may produce reflectance of greater than about 98% at a wavelength of between about 650 nm and about 900 nm of light having an angle of incidence of between about 50° and about 90°, e.g., the coating is an HR coating. Of course, other ranges and reflectances are possible, depending on the choice of the alkali, the specified transmissions and/or reflectances, the materials, thicknesses, and numbers of alternating layers, etc., and a multilayer dielectric coating 500 may be designed as desired as would be apparent to one of skill in the art upon reading the present descriptions.

In one embodiment, an innermost layer 506 of the two or more alternating layers may protect subsequent layers 508 from alkali attack. This innermost layer 506 may comprise at least one of: alumina, zirconia, and hafnia; and more preferably, it may comprise alumina. According to a further embodiment, the subsequent layers 508 of the two or more alternating layers may comprise alternating layers of at least two of: zirconia, alumina, tantala, hafnia, silica, niobia, magnesium oxide, or beryllium oxide.

In a preferred embodiment, the higher index oxide material 502 may be chosen from: zirconia, hafnia, tantala, and niobia, among others. In another preferred embodiment, the lower index oxide material 504 may be chosen from: alumina, silica, zirconia, hafnia, magnesium oxide, and beryllium oxide, among others. The index of the materials chosen are higher or lower in relation to each other, and not necessarily to any standard or baseline index value.

The choice of the subsequent layers 508 may be based on cost, ease of production, reflectance of the finished coating, etc. Preferably, two adjacent layers are not formed of the same material, e.g., the layers form alternating layers of higher and lower index materials.

According to additional embodiments, a thickness of the innermost layer 506 may be between about 500 nm and about 1000 nm, and in another embodiment designed for harsher alkali atmospheres, the thickness of the innermost layer 506 may be greater than about 1000 nm.

In a more specific embodiment, a multilayer dielectric coating 500 may include alumina, zirconia, and/or hafnia, as an innermost layer 506 of the multilayer coating. A preferred embodiment includes alumina as the innermost layer. The innermost layer is the layer adjacent to the vapor having the alkali in an alkali laser. In this way, the alkali resistant layer is operable to protect other layers of the multilayer coating, along with other materials, such as a substrate, in the alkali laser or other device that contacts an alkali vapor, from attack by the alkali. In some approaches, the innermost layer may be at least about 250 nm thick, more preferably at least about 500 nm thick, and even more preferably greater than about 1000 nm thick for use in harsher alkali atmospheres.

In more approaches, the alternating layers may be formed above a substrate 512 positioned on a non-alkali contacting side of the multilayer dielectric coating 500. The substrate may be formed of any material known in the art, such as sapphire, fused silica, glass, ceramic alumina, etc.

Figure 6:
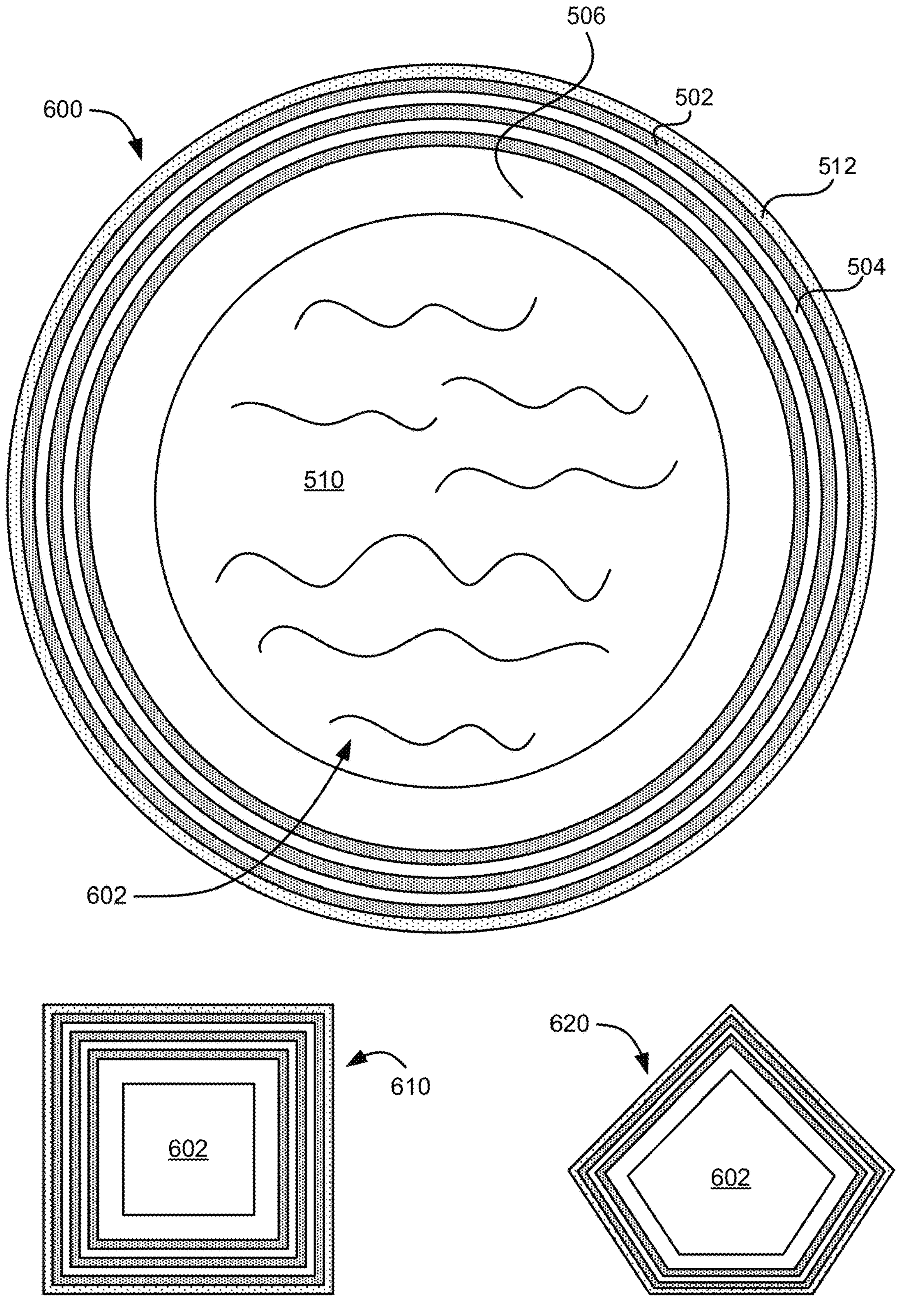
FIG. 6 shows schematic diagrams of several structure having interiors and a multilayer dielectric coating, according to various embodiments.

Now referring to FIG. 6, several structures 600, 610, 620 are shown, each structure having an interior 602 and a dielectric coating, according to various embodiments. The structures 600, 610, 620 are not shown to scale, and in most applications, the interior 602 of the structure may be much larger than shown in the figures, and the thicknesses and number of the layers may be different than shown. The substrate 512 may define this structure 600 having a cylindrical or oval cross-section, or any other structure, such as one having a rectangular cross-section 610, a polygonal cross-section, an irregular polygonal cross-section 620, etc., according to various embodiments. In any of these embodiments, the higher index oxide material 502 and the lower index oxide material 504 may be concentric layers in the interior 602 of the structure (as shown for the cylindrical structure 600). In all cases, the innermost layer 506 provides protection to subsequent layers from alkali attack when an alkali vapor 510 is present in the interior 602, and may be formed thicker than the subsequent layers, as shown in the figures.

Also, the lower index oxide material 504 may be an innermost layer 506 of the concentric layers, and the lower index oxide material 504 may preferably comprise alumina, in one embodiment. However, layers of the lower index oxide material 504 other than the innermost layer 506 may comprise any other low index oxide material, such as alumina, silica, magnesium oxide, etc.

In another preferred embodiment, the innermost layer 506 may have a density of greater than about 97% of its theoretical density, i.e., the density of the crystalline material, whether it be alumina, zirconia, or hafnia. This density may be achieved by using ALD or IBS formation methods, among others. The high density of the innermost layer enables protection of the other layers and a substrate from attack by the alkali vapor.

In more embodiments, other multilayer pair options for optical coatings are possible, such as silica and hafnia, silica and alumina, silica and zirconia, etc., and may alternatively be used as long as alumina, zirconia or hafnia is applied as the innermost layer 506, as described above.

In one embodiment, the innermost layer 506 of the concentric layers comprising alumina may have a density of greater than about 97% of a theoretical density of alumina.

According to further embodiments, any of the structures 600, 610, 620 may form a gas cell, and may contain, hold, surround, and/or include an alkali vapor and a buffer gas within the structure 600, 610, 620, thereby forming, as shown in FIG. 2, an alkali vapor and buffer gas cell 202. Additionally, as shown in FIG. 2, a dot reflector 212 may be positioned on an end of the alkali vapor and buffer gas cell 202 for forming a laser beam 204. Any of the other associated components as shown in FIG. 2 may also be included in an alkali gas laser 200, such as a vessel 206 for holding the alkali metal, a hollow lens duct 208, a radiance conditioned diode array 210, etc.

In another embodiment, an alkali gas laser 200 may include an alkali vapor and a buffer gas within a gas cell 202, wherein walls of the gas cell 202 comprise a multilayer dielectric coating as described herein according to any embodiment. Additionally, the alkali gas laser 200 may include a (HR) dot reflector 212 for forming a laser beam 204.

In an even more preferred embodiment, the entirety of the multilayer dielectric coating may comprise alkali resistant materials, such as an alkali resistant material in a single layer coating, a multilayer coating comprising two alkali resistant materials, etc. In one such embodiment, the alkali resistant multilayer coating may comprise alumina and zirconia in alternate or alternating layers, comprising two layers, three layers, four layers, ten layers, 100 layers, etc. In this case, although both materials are resistant to alkali attack, the innermost layer may comprise the most alkali resistant material, alumina, and it may be applied as discussed above, e.g., through IBS.

Figure 7:
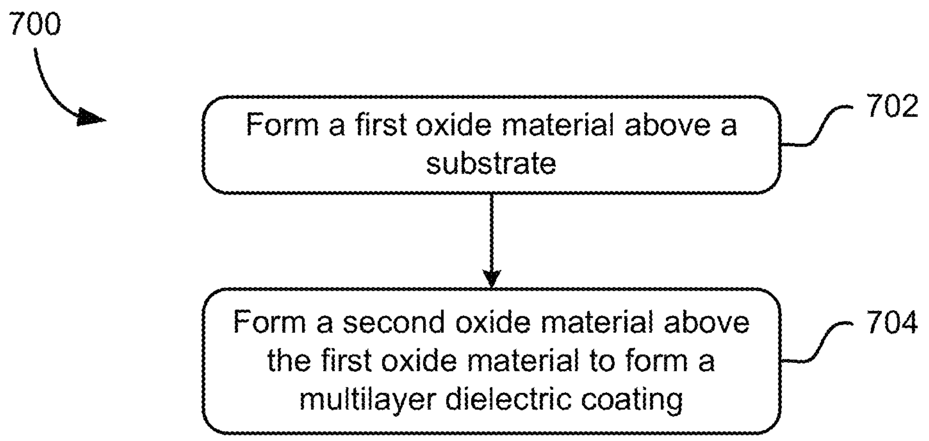
FIG. 7 is a flow diagram of a method for forming an alkali resistant coating according to one embodiment.

Now referring to FIG. 7, a method 700 for forming an alkali resistant coating is shown according to one embodiment. The method 700 may be carried out in any desired environment. Of course, the method 700 may include more or less operations than those shown in FIG. 7, as would be apparent to one of skill in the art upon reading the present descriptions.

In operation 702, a first oxide material is formed above a substrate. Any formation method may be used, as known in the art, such as IBS, CVD, etc.

In operation 704, a second oxide material is formed above the first oxide material to form a multilayer dielectric coating. The second oxide material is on a side of the multilayer dielectric coating for contacting an alkali, when the coating is in use.

In one embodiment, additional alternating layers of the first oxide material and the second oxide material may be formed that number more than 10 total layers, more than 100 layers, more than 300 layers, more than 1000 layers, etc.

In another embodiment, the multilayer dielectric coating may produce reflectance of greater than about 98% at a 780 nm wavelength of light having an angle of incidence of between about 50° and about 90°, e.g., the coating is an HR coating.

In another embodiment, the multilayer dielectric coating may produce reflectance of less than about 5% at an angle of incidence of about 0° for a wavelength of light of between about 650 nm and about 900 nm, e.g., the coating is an AR coating.

In another embodiment, the substrate may define a structure having an interior. In this embodiment, the first oxide material and the second oxide material may form concentric layers in the interior of the structure, and the second oxide material is an innermost layer of the concentric layers, thereby allowing it to protect subsequent layers from attack from an alkali vapor that may be included in the interior. In a further embodiment, the innermost layer of the concentric layers may include at least one of: alumina, zirconia, and hafnia, among other alkali resistant materials.

In another embodiment, the innermost layer of the concentric layers may include alumina, and a density of the innermost layer is greater than about 97% of a theoretical density of alumina.

According to one approach, the subsequent layers may include alternating layers of at least two of: alumina, zirconia, tantala, hafnia, or silica, preferably in an arrangement where a high index oxide material is alternated with a low index oxide material.

In more approaches, the innermost layer of the concentric layers may be formed to a thickness of greater than about 250 nm, 1000 nm, etc.

In another embodiment, the substrate may include, but is not limited to, any one of: sapphire, fused silica, glass, ceramic alumina, or any combination thereof.

In a preferred embodiment, at least the second oxide material may be formed via ion beam sputtering, or any other method capable of depositing a highly dense structure, e.g., with a density of greater than about 97% of a theoretical density of the material.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method for forming an alkali vapor resistant multilayer dielectric coating for use in an optical component of an alkali laser, the method comprising:

forming a first oxide material of an alkali laser multilayer dielectric coating above a substrate; and forming a second oxide material of the alkali laser multilayer dielectric coating above the first oxide material;

wherein forming the first oxide material and forming the second oxide material are performed using a deposition technique consisting of atomic layer deposition (ALD); and wherein the second oxide material is on a side of the alkali laser multilayer dielectric coating for contacting an alkali vapor;

wherein the alkali laser multilayer dielectric coating is resistant to reduction upon contact with the alkali vapor;

wherein the first and second oxide materials are each independently selected from the group consisting of: alumina, hafnia, and zirconia; and wherein the first and second oxide materials have relatively higher and lower refractive indices with respect to one another.

2. The method as recited in claim 1, comprising producing, at a surface of the alkali vapor resistant multilayer dielectric coating: reflectances of less than about 5% in response to a laser beam applied to the surface of the alkali vapor resistant multilayer dielectric coating at an angle of incidence of about 0°, the laser beam having a wavelength of between about 650 nm and about 900 nm.

3. The method as recited in claim 1, comprising producing, at a surface of the alkali vapor resistant multilayer dielectric coating, reflectances of less than about 5% in response to a laser beam applied to the surface of the alkali vapor resistant multilayer dielectric coating at an angle of incidence of about 0°, the laser beam being characterized by a wavelength of approximately 780 nm.

4. The method as recited in claim 1, wherein the substrate defines a structure having an interior;

wherein the first oxide material and the second oxide material form concentric layers in the interior of the structure;

wherein the second oxide material is an innermost layer of the concentric layers;

wherein the innermost layer of the concentric layers protects subsequent layers from alkali attack, the innermost layer of the concentric layers comprising at least one of: alumina, zirconia, and hafnia; and wherein the innermost layer of the concentric layers comprises alumina, and wherein a density of the innermost layer is greater than about 97% of a theoretical density of alumina.

5. The method as recited in claim 4, wherein the innermost layer of the concentric layers is formed to a thickness of greater than about 500 nm.

6. The method as recited in claim 1, wherein subsequent layers of the alkali vapor resistant multilayer dielectric coating independently comprise alternating layers comprising at least one material selected from a group consisting of: an oxide of tantalum, an oxide of niobium, an oxide of beryllium, and an oxide of silicon.

7. The method as recited in claim 1, wherein the substrate comprises a material selected from a group consisting of: polycrystalline alumina, niobium, stainless steel, and an iron/nickel alloy.

8. The method as recited in claim 1, wherein one or more layers comprising the first oxide material are formed to a thickness greater than about 250 nm.

9. The method as recited in claim 1, wherein one or more layers comprising the first oxide material are formed to thickness greater than about 500 nm.

10. The method as recited in claim 1, wherein the first oxide material is not porous and does not absorb water.

11. A method for forming an alkali vapor resistant multilayer dielectric coating, comprising:

forming, via chemical vapor deposition (CVD), two or more alternating layers of oxide materials above a substrate, the oxide materials of the alternating layers having relatively higher and lower refractive indices with respect to one another, wherein an innermost layer of the two or more alternating layers is on an alkali-contacting side of the alkali resistant coating, wherein the innermost layer of the two or more alternating layers comprises alumina; and wherein subsequent layers of the two or more alternating layers independently comprise at least one material selected from a group consisting of: alumina, zirconia, and hafnia.

12. The method as recited in claim 11, wherein the two or more alternating layers comprises at least one of:

one or more anti-reflection (AR) layers configured to reflect less than about 5% of radiation having a wavelength between about 650 nm and about 900 nm for an angle of incidence of about 0°; and one or more high reflection (HR) layers configured to reflect greater than about 98% of radiation having a wavelength between about 650 nm and 900 nm for an angle of incidence between about 50° and about 90°.

13. The method as recited in claim 11, wherein the innermost layer of the two or more alternating layers is configured to be in direct contact with an alkali vapor on the alkali-contacting side of the substrate.

14. The method as recited in claim 11, wherein the two or more alternating layer are alternating layers each independently comprising one or more of zirconia, hafnia, and alumina.

15. The method as recited in claim 11, wherein the substrate comprises a material selected from a group consisting of: polycrystalline alumina, niobium, stainless steel, or an iron/nickel alloy.

16. The method as recited in claim 11, wherein the two or more alternating layers of oxide materials comprise:

the innermost layer;

a first subsequent layer comprising hafnia;

a second subsequent layer comprising alumina;

a third subsequent layer comprising zirconia;

a fourth subsequent layer comprising hafnia;

a fifth subsequent layer comprising zirconia; and a sixth subsequent layer comprising alumina.

17. The method as recited in claim 1, comprising producing, at a surface of the alkali vapor resistant multilayer dielectric coating:

reflectances of less than about 5% in response to a laser beam applied to the surface of the alkali vapor resistant multilayer dielectric coating at an angle of incidence of about 0°, the laser beam having a wavelength of between about 650 nm and about 900 nm; and reflectances of greater than about 98% in response to a laser beam applied to the surface of the alkali vapor resistant multilayer dielectric coating at an angle of incidence of about 0°, the laser beam being characterized by a wavelength of approximately 780 nm; and wherein the substrate defines a structure having an interior;

wherein the substrate comprises a material selected from a group consisting of: polycrystalline alumina, niobium, stainless steel, and an iron/nickel alloy;

wherein the first oxide material and the second oxide material form concentric layers in the interior of the structure;

wherein the first oxide material has an index of refraction that is different than an index of refraction of the second oxide material;

wherein the first oxide material is not porous and does not absorb water;

wherein the second oxide material is an innermost layer of the concentric layers;

wherein the innermost layer of the concentric layers protects subsequent layers from alkali attack;

wherein the innermost layer of the concentric layers comprises alumina;

wherein a density of the innermost layer of the concentric layers is greater than about 97% of a theoretical density of alumina;

wherein the innermost layer of the concentric layers is formed to a thickness of greater than about 500 nm;

wherein one or more layers comprising the first oxide material are formed to a thickness greater than about 500 nm; and wherein subsequent layers of the alkali vapor resistant multilayer dielectric coating independently comprise alternating layers comprising at least one material selected from a group consisting of: an oxide of tantalum, an oxide of niobium, an oxide of beryllium, and an oxide of silicon.

* * * * *